United States Patent
Newman

(10) Patent No.: US 8,421,403 B2
(45) Date of Patent: Apr. 16, 2013

(54) THERMOELECTRIC POWER GENERATING EXHAUST SYSTEM

(75) Inventor: Michael D. Newman, Hillsborough, NJ (US)

(73) Assignee: Linde Aktiengesellschaft (DE)

( * ) Notice: Subject to any disclaimer, the term of this patent is extended or adjusted under 35 U.S.C. 154(b) by 280 days.

(21) Appl. No.: 12/897,851

(22) Filed: Oct. 5, 2010

(65) Prior Publication Data
US 2012/0081066 A1   Apr. 5, 2012

(51) Int. Cl.
*H01M 10/46* (2006.01)
*H01L 35/30* (2006.01)

(52) U.S. Cl.
USPC .......................... 320/101; 136/208

(58) Field of Classification Search ............. 320/101; 136/208
See application file for complete search history.

(56) References Cited

U.S. PATENT DOCUMENTS

| | | | |
|---|---|---|---|
| 2,597,752 A | 5/1952 | Salisbury | |
| 6,096,966 A * | 8/2000 | Nishimoto et al. | 136/205 |
| 6,598,405 B2 | 7/2003 | Bell | |
| 6,986,247 B1 * | 1/2006 | Parise | 60/284 |
| 2005/0172631 A1 * | 8/2005 | Primlani | 60/698 |
| 2006/0090787 A1 * | 5/2006 | Onvural | 136/212 |
| 2009/0301539 A1 * | 12/2009 | Watts | 136/201 |
| 2010/0186422 A1 * | 7/2010 | Yang et al. | 62/3.3 |
| 2011/0283705 A1 * | 11/2011 | Oliver | 60/698 |

* cited by examiner

*Primary Examiner* — M'baye Diao
(74) *Attorney, Agent, or Firm* — Joshua L. Cohen

(57) ABSTRACT

An exhaust system for generating power includes a conduit in communication with a first atmosphere having a first temperature and through which said first atmosphere can flow, the conduit having an inner surface exposed to said first atmosphere and an exterior surface exposed to a second atmosphere having a second temperature external to the conduit; a thermoelectric power generating assembly mounted to the exterior surface of the conduit, said power generating assembly responsive to a temperature difference between the first and second atmospheres for providing electrical power.

8 Claims, 1 Drawing Sheet

THERMOELECTRIC POWER GENERATING EXHAUST SYSTEM

BACKGROUND

The present embodiments relate to the generation of power from temperature differentials.

Exhaust gases from for example a cryogenic freezing system or process typically are discharged outside of the facility directly to the atmosphere. Such exhaust gases are generally very cold, i.e. minus 40° F. to minus 100° F., and in certain applications much colder. Such exhaust gases also have the capacity for significant additional refrigeration loads. It is estimated that from between 15% to 20% of total refrigeration capacity from a cryogenic fluid is lost when the gas is discharged from the freezing process.

It is known that voltage produced is proportional to a temperature difference between two junctions. That is, the proportionality constant alpha ($\alpha$) is known as the Seebeck coefficient (represented in the equation below), and is often referred to as thermoelectric power or thermopower. A voltage difference produced across terminals of an open circuit made from a pair of dissimilar metals whose two junctions are at different temperatures, is directly proportional to the difference between the hot and cold junction temperatures. Seebeck voltage does not depend on the distribution of temperature along metals between junctions of same, such as is required in a thermocouple.

$$V = \alpha(T_h - T_c)$$

The voltage difference, V, produced across the terminals of an open circuit made from a pair of dissimilar metals, A and B, whose two junctions are held at different temperatures, is directly proportional to the difference between the hot and cold junction temperatures, Th–Tc.

BRIEF DESCRIPTION OF THE DRAWINGS

For a more complete understanding of the present embodiments, reference may be had to the following drawing figures taken in conjunction with the description of the embodiments, of which.

DETAILED DESCRIPTION OF THE INVENTION

Figure 1:
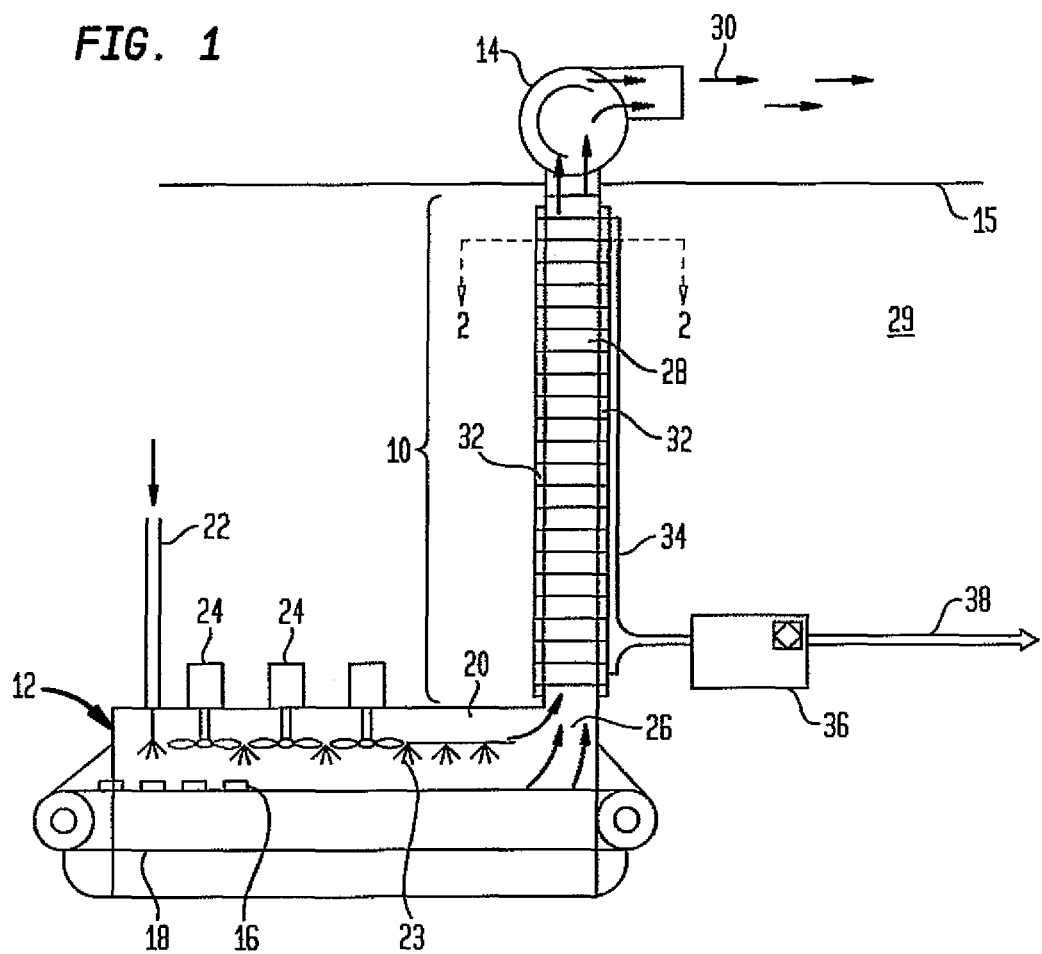
FIG. 1 shows a side view in cross section of a thermoelectric power generating exhaust system embodiment of the present invention.
Figure 2:
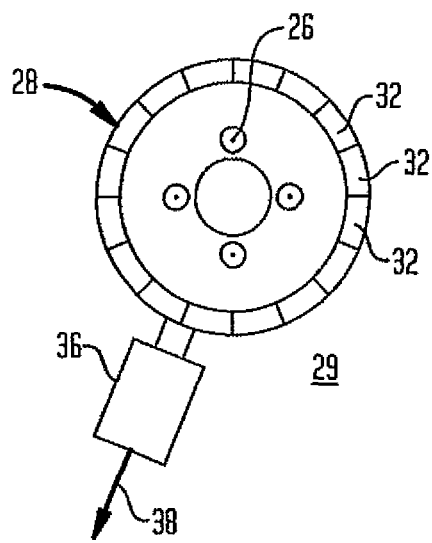
FIG. 2 shows a cross section taken along line 2-2 of FIG. 1.

Referring to FIGS. 1 and 2, a thermoelectric power generating exhaust system embodiment is shown generally at 10, and is connected to and in communication at one end with a freezer 12 and at another end to an exhaust blower 14. The blower may be mounted to a roof 15 of a facility in which the freezer 12 is disposed. The freezer 12 can be any type of freezer, such as for example a tunnel, spiral or immersion freezer. Products 16, such as for example food products, are transported on a conveyor belt 18 through a chamber 20 of the freezer 12. The freezing substance, such as liquid cryogen, introduced through pipe 22 flashes in the chamber 20 to produce a cryogenic gas which is circulated by fans 24. The pipe 22 may be connected to spray nozzles 23 arranged in the chamber 20.

The cold exhaust gas 26, represented by arrows 26 in FIG. 1 and plumes in FIG. 2 due to the view of said FIG. 2, is emitted from the freezer 12 through an exhaust duct 28 or flue having a first end in communication with the chamber 20 of the freezer 12, the chamber 20 including an atmosphere having a first temperature. A second, remote end of the exhaust duct 28 is in communication with the blower 14 which draws the exhausted cryogenic gas as indicated by arrows 26,30 from the chamber 20 through the duct 28 to an external atmosphere or an area outside the plant or facility.

The exhaust duct 28 includes an inner surface in contact with the atmosphere being exhausted 26 from the chamber 20. An exterior surface of the exhaust duct 28 is provided with at least one or alternatively a plurality of thermoelectric power generator plates 32. The exterior surface temperature can be cooled or heated by conduction with respect to a temperature at the inner surface. The generator plates 32 are connected by wiring 34 to a power storage device 36, or a battery and an inverter which converts direct current (DC) to alternating current (AC). The battery storage device 36 provides storage of the electricity produced by the difference between the colder temperature of the exhaust duct 28 and the warmer ambient air external to the duct 28 such as for example the warmer atmosphere shown generally at 29. The difference in this temperature provides the delta T ($\Delta$T).

That is, as shown by FIGS. 1 and 2, the cold exhaust discharge 26 proceeding through the exhaust duct 28 cools the duct to a temperature which is sufficiently lower than the ambient air 29 outside the duct 28, such that the delta T provides the energy necessary in order to provide electricity.

In the present embodiments, an exterior surface of the exhaust duct 28 is provided with the thermoelectric power generating plates 32 in contact with the cooler exhaust duct 28. The difference in temperature between an inside surface of each one of the plates 32 and the outside (the ambient air of the closed plant facility) can be in certain instances in excess of 150° F. (65.6° C.). This temperature difference results in a voltage difference across each one of the plates 32. Power can therefore be generated from the temperature difference provided by this construction.

EXAMPLE

With a temperature differential of 150° F. (65.6° C.), one can generate approximately 7.5 watts (W) for every 5 inches² of surface area. With a cryogenic exhaust duct of 10 inches in diameter and having a 20 foot length, the total exposed cold area of the duct is 7,732 in². If the entire surface of the exhaust duct were covered in for example the generator plates 32, it would be possible to generate in excess of 11 Kw of power from such a system.

The power generated by the apparatus 10 of the present embodiments is fed into the battery storage device 36, which power can either be returned to the grid or used in other processes as indicated by arrow 38.

While the embodiments above have been discussed with respect to a freezer 12, wherein cold exhaust gas is employed, the present embodiments can also be used with an oven. Substituting an oven for the freezer, the extremely hot exhaust gases passing through the duct 28 would provide the delta T with for example a colder atmosphere 29, which would provide the temperature difference sufficient for the thermoelectric power generator plates 32 to generate electricity.

It will be understood that the embodiments described herein are merely exemplary, and that one skilled in the art may make variations and modifications without departing from the spirit and scope of the invention. All such variations and modifications are intended to be included within the scope of the invention as described and claimed herein. Further, all embodiments disclosed are not necessarily in the alternative, as various embodiments of the invention may be combined to provide the desired result.

What is claimed is:

1. An exhaust system for generating power, comprising:
   a conduit in communication with a first cryogen atmosphere having a first temperature and through which said first cryogen atmosphere can flow, the conduit comprising an inner surface exposed to said first cryogen atmosphere and an outer surface at an exterior of the conduit exposed to a second atmosphere having a second temperature external to the conduit and greater than the first temperature; and
   a thermoelectric power generating assembly mounted to the outer surface of the conduit, said power generating assembly responsive to a temperature difference between the first cryogen atmosphere and the second atmosphere for providing electrical power.

2. The exhaust system of claim 1, wherein the conduit comprises an exhaust flue and said first cryogen atmosphere is from a freezer.

3. The exhaust system of claim 1, wherein the thermoelectric power generating assembly comprises at least one thermoelectric power generator plate.

4. The exhaust system of claim 1, wherein the thermoelectric power generating assembly comprises a plurality of thermoelectric power generating plates mounted to the outer surface of the conduit.

5. The exhaust system of claim 4, wherein the plurality of thermoelectric power generating plates cover the outer surface of the conduit.

6. The exhaust system of claim 1, further comprising a blower in communication with the conduit for moving the first cryogen atmosphere through the conduit.

7. The exhaust system of claim 1, further comprising a power storage device connected to the thermoelectric power generating assembly for storing power generated by said power generating assembly.

8. The exhaust system of claim 7, wherein the power storage device comprises a battery and an inverter for converting direct current electrical power to alternating current electrical power.

* * * * *